United States Patent [19]

Simone

[11] Patent Number: 4,733,403
[45] Date of Patent: Mar. 22, 1988

[54] DIGITAL ZERO IF SELECTIVITY SECTION

[75] Inventor: Daniel A. Simone, Barrington, Ill.

[73] Assignee: Motorola, Inc., Schaumburg, Ill.

[21] Appl. No.: 861,958

[22] Filed: May 12, 1986

[51] Int. Cl.$^4$ .......................... H04B 1/10; G06G 7/02
[52] U.S. Cl. ...................................... 375/103; 375/75; 375/122; 364/825; 328/167
[58] Field of Search ..................... 375/103, 75, 82, 94, 375/96, 99, 78, 122; 455/324, 339, 340; 364/724, 825; 370/118, 123, 84; 333/203, 173; 381/29–31; 307/353, 520; 328/151, 167; 358/138

[56] References Cited

U.S. PATENT DOCUMENTS

| | | | |
|---|---|---|---|
| 3,303,335 | 2/1967 | Pryor | 375/96 |
| 3,979,701 | 9/1976 | Tomozawa . | |
| 4,057,759 | 11/1977 | Genova et al. . | |
| 4,246,653 | 1/1981 | Malm . | |
| 4,313,211 | 1/1982 | Leland . | |
| 4,346,477 | 8/1982 | Gordy . | |
| 4,356,559 | 10/1982 | Candy et al. . | |
| 4,384,357 | 5/1983 | deBuda et al. . | |
| 4,419,759 | 12/1983 | Poklemba . | |
| 4,455,680 | 6/1984 | Villarreal . | |
| 4,559,499 | 3/1984 | Bursztejn . | |
| 4,589,110 | 5/1986 | Eng et al. | 375/122 |
| 4,623,922 | 11/1986 | Wischermann | 358/138 |

FOREIGN PATENT DOCUMENTS

| | | |
|---|---|---|
| 2158378 | 5/1982 | Fed. Rep. of Germany . |
| 2081047 | 2/1982 | United Kingdom . |

OTHER PUBLICATIONS

"Improved Decimating FIR Filter", by Lambert and Longley, Motorola Technical Developments, vol. 5, Oct. 1985, pp. 39–40.

"New Recursive Digital Filter Structures Having Very Low Sensitivity and Roundoff Noise, by Agaral et al., IEEE Trans. on Circuits and Systems, vol. CAS-22, No. 12, Sec. 1975.

"Low Sensitivity Digital Ladder Filters", by Bruton, IEEE Trans. on Circuits and Systems, vol. CAS-22, No. 3, Mar. 1975.

"Low Cost RF/LST Technologies for Commercial GPS Receivers", by Chao, Microwave System, App. Technology Conf., Wash., D.C., Mar. 1983.

"A Low-Cost GPS Land Receiver for Land Navigation", by Yiu et al., Journal of the Institute of Navigation, vol. 29, No. 3, Fall 1982.

"Digital Filtering by Polyphase Network: Application to Samples Rate Alteration and Filter Banks", by Bellanger et al., IEEE Trans. on Acoustics, Speech, and Signal Processing, vol. ASSP-24, No. 2, Apr. 1976.

"A Digital Frequency Synthesizer", by Tierney et al., IEEE Trans. on Audio and Electroacoustics, vol. AV-19, No. 1, Mar. 1971.

"Digitizing Multiple of Signals Requires an Optimum Sampling Rate", by Stephenson, Electronics, pp. 106–110, Mar. 27, 1972.

*Primary Examiner*—Robert L. Griffin
*Assistant Examiner*—M. Huseman
*Attorney, Agent, or Firm*—Robert J. Crawford

[57] ABSTRACT

Disclosed is a digital zero-IF selectivity section circuit which operates on a recovered input signal, digitally clocked by a first clock at a rate of FS, in receiver device. The circuit uses a second clock operating at a lesser rate than the first clock to clock an N-order FIR digital filtering means to selectively band-limit the frequency spectrum of the recovered input signal. A second digital filtering means is coupled to the output of the first FIR digital filtering means. The second digital filtering means operates at a clock speed less than or equal to the second clock speed. The second digital filtering means is used to further selectively band-limit the frequency spectrum of the recovered input signal.

26 Claims, 6 Drawing Figures

DESIRED (FULL SPEED) FILTER

NON-RECURSIVE FILTER

HALF SPEED FILTER

OVERALL (HALF SPEED) RESPONSE

DIGITAL ZERO IF SELECTIVITY SECTION

BACKGROUND OF THE INVENTION

This invention relates generally to intermediate frequency circuits and more particularly to digital intermediate frequency circuits where the intermediate frequency is zero Hertz.

Traditionally, intermediate frequency (IF) sections have been employed in transmitters and receivers to perform the major portion of a radio's selectivity since it may be technically difficult, or cost prohibitive, to develop sufficiently selective filters at the transmitted or received frequency. Transceivers may have more than one IF section. For example, some receivers employ two IF sections for recovering the transmitted information. These receivers are generally referred to as dual conversion receivers, whereas a single IF receiver would be referred to as a singular conversion receiver. Generally, any receiver with an intermediate frequency of zero Hertz is referred to as a direct conversion receiver.

Analog implementations of direct conversion receivers suffer from a variety of detriments including local oscillator (LO) radiation, which results from imperfect reverse isolation through the mixers, and may desense nearby receivers. Further, radio desense performance can be degraded by nonlinear effects in the mixers causing self-mixing of on-and off-channel signals which creates DC offsets and audio distortion. Also, in an application involving the reception of frequency modulated (FIR) signals, the direct conversion analog receiver has no means of limiting the zero-IF signal. This causes unpredictable performance in fading and other adverse conditions.

The aforementioned dual conversion receiver alleviates some of the direct conversion problems. The additional isolation obtained by a dual conversion receiver solves the LO radiation problem. However, the solution is achieved at the cost of an additional mixer and local oscillator, in addition to a narrow band (generally crystal) filter to achieve the required isolation. Further, having a traditional IF section prior to the DC-IF section essentially band-limits the incoming signal to one channel. Thus, the self-mixing products caused by the nonlinear effects of the mixers generally will not fall into the passband of the filter in a dual conversion receiver.

Although the dual conversion receiver solves many of the problems experienced by the direct conversion receiver (although at additional cost and size requirements), the dual-conversion receiver experiences other detriments. As previously mentioned, the direct conversion FM receiver cannot limit the zero-IF signal. Thus, the use of unconventional detection methods are required. The typical solution to this problem is to upconvert the zero-IF signal to a third IF frequency where it can be limited and detected using conventional circuits. Up-converting requires another local oscillator, additional mixers and a summing circuit.

Further, up-converting creates yet another problem. The quadrature paths in an analog receiver cannot be perfectly balanced for amplitude and phase characteristics because of the nonexact performance of the mixers and filters. Thus, a beat-note is created due to imperfect cancellation in the summer which degrades hum and noise performance and causes audio distortion. A proposed solution to this problem is to phase lock the LO to an incoming pilot signal. This necessitates additional circuitry at the transmitter to transmit the pilot signal and also requires additional circuitry at the receiver to develop the phase lock loop and pilot filters. Lastly, the phase lock loop lock-time and pull-in range become critical receiver parameters.

Even more recent attempts to resolve the above-mentioned problems using digital receiver implementations have failed to provide a practical, cost-effective arrangement. The hardware necessary to meet the selectivity section requirements should be minimized to lessen circuit board real estate and power consumption in the radio. Generally, however, a significant amount of parallel architecture is needed to accommodate the substantially high data rates required in such an implementation. Moreover, since such designs are often sought to be implemented within integrated circuits, hardware minimization is highly advantageous. Hence, when designing a selectivity section to resolve the above-mentioned problems, it is important to minimize the hardware and power consumption for a practical implementation, while still allowing operation at sufficiently high data rates.

Although the above discussion has concerned receivers, similar problems are experienced in transmitter IF sections, even though transmitter IF topologies are generally different than those employed in receivers. Generally, any analog implementation of an IF section will experience temperature and part-to-part variations that may degrade the IF section performance.

Therefore, a need exists for an IF section that is insensitive to part and temperature variations and solves the above mentioned problems experienced in analog implementations of IF sections.

OBJECTS AND SUMMARY OF THE INVENTION

Accordingly, it is an object of the present invention to provide a digital zero-IF selectivity section that alleviates the aforementioned problems experienced in analog implementations.

It is a further object of the present invention to provide a digital zero-IF section capable of operating at high sampling rates.

It is a further object of the present invention to provide a digital zero-IF section that requires a minimal amount of hardware for implementation.

In practicing the present invention, a digital zero-IF selectivity section circuit is provided which operates on a recovered input signal, clocked by a first clock at a rate of FS, in a receiver device. The circuit uses a second clock operating at a lesser rate than the first clock coupled to an N-order FIR digital filtering means for selectively band-limiting the frequency spectrum of the recovered input signal. A second digital filtering means is coupled to the output of the first FIR digital filtering means. The second digital filtering means operates at a clock speed less than or equal to the second clock speed. The second digital filtering means is used to further selectively band-limit the frequency spectrum of the recovered input signal.

The second clock preferably operates at a rate equal to one half the first clock rate. Further, it is preferred that the second clock is used to clock the second digital filtering means, and that the first N-order digital filtering means provides aliasing error protection at the input of the second digital filtering means.

DETAILED DESCRIPTION OF THE PREFERRED EMBODIMENT

Figure 1:
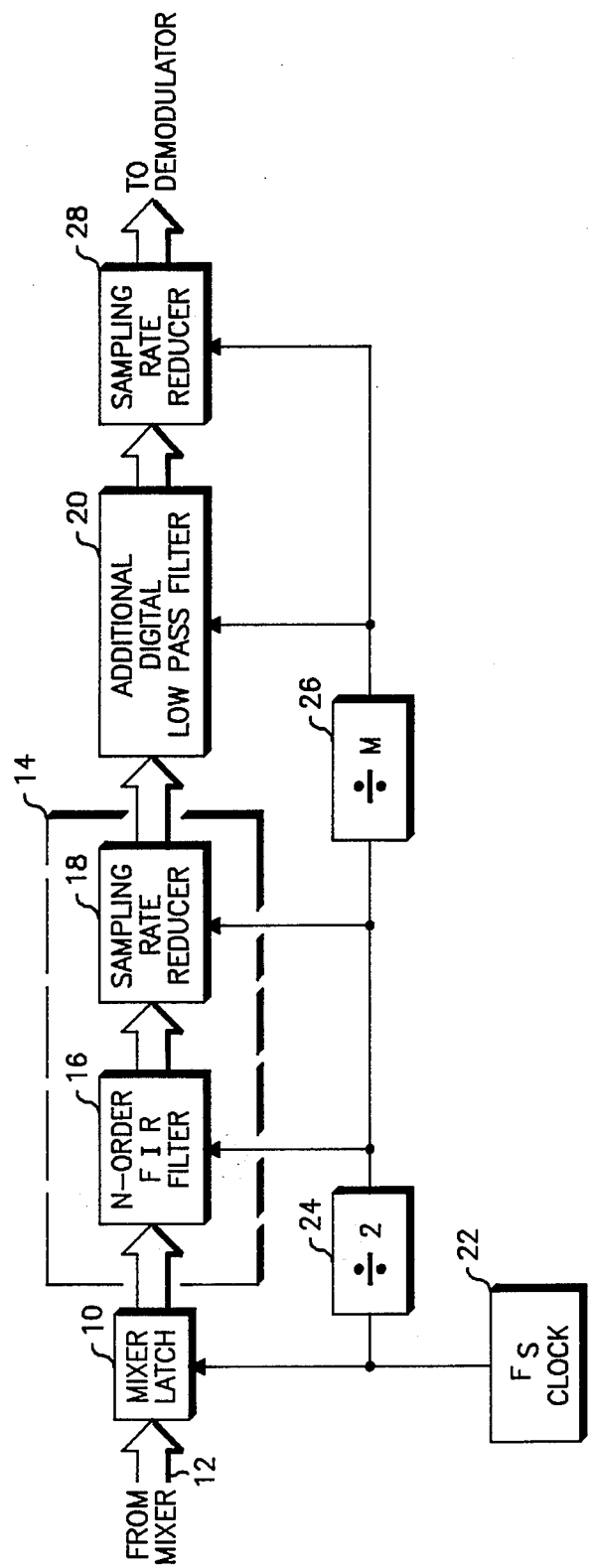
FIG. 1 is a block diagram of a digital zero-IF selectivity section especially adapted for use in a receiver, according to the present invention.

Referring now to FIG. 1, a digital zero-IF selectivity section is depicted in block diagram form in accordance with the present invention. Digital data is routed to a mixer latch 10 from a digital mixer (not shown). The digital mixer would typically be mixing a local oscillator signal with the output of an A/D converter operating on the incoming signal. The mixer thereby provides the input zero IF signal 12. The zero IF signal is bussed to an N-order decimating filter 14. The digital data is typically routed on an L-bit data bus, representing an L-bit digital word. The length of the word depends upon factors including: the dynamic range required, and the amount of roundoff and quantization noise that can be tolerated in the given application. For example, a word length of 16 bits may be considered to have an acceptable performance in receiving a typical radio signal sampled at 20 MHz.

The N-order decimating filter 14 is necessary to accommodate the high sampling rate of the received signal, shown to be 20 MHz. One skilled in the art can appreciate that this high speed operation is necessary to minimize intermodulation problems occurring with the circuitry around the A/D converter. An IIR (infinite impulse response) low pass filter could not practically accommodate such a sampling rate since IIR low pass filters are implemented as recursive filters, which cannot be pipelined to increase their speed. Their speed is determined by the maximum delay around a closed path, i.e., the feedback path. Hence, practical accommodation must be made for this high sampling rate.

The N-order decimating filter 14 may be comprised of an N-order FIR (finite impulse response) filter 16 and a first sampling rate reducer 18. The N-order FIR filter 16 is used to reduce to acceptably small levels the aliasing error, also known as frequency band foldback, which is introduced when implementing a scheme involving sampling rate reduction. One skilled in the art can appreciate that implementation of a FIR digital filter operating on a band limited signal at the Nyquist sampling rate (a rate equal to twice the peak frequency to be recovered) should theoretically prevent aliasing. However, from a practical view point, samples should be taken at a rate much greater than the Nyquist rate to alleviate the need for high order filtering, or rather, a very sharp cutoff characteristic.

The first sampling rate reducer 18 provides the operating speed reduction discussed above. Although there are several ways to implement such reduction, the technique preferred is subsequently discussed with FIG. 2.

Following the first sampling rate reducer 18 is an additional digital low pass filter 20, such a digital filter is described in "New Recursive Digital Filter Structures Having Very Low Sensitivity and Roundoff Noise", Agarwal and Burrus, *IEEE Transactions on Circuits and Systems*, Vol. Cas-22, No. 12, December 1975. Typically implemented as a recursive IIR filter, the low pass filter 20 provides the desired band-limiting frequency characteristic. This would not otherwise be practical without the reduced operating speed provided by the decimating FIR filter 16. A clock 22 operating at the frequency sampling rate, FS, provides clock to the mixer latch 10 and a divide-by-2 circuit 24 provides half the frequency sampling rate clock, FS/2, to the N-order decimating FIR filter 16 and the first sampling rate reducer 18. An optional divide-by-M circuit 26 provides clock to the digital low pass filter 20, where M is equal to 1 when the filter 20 is employed as an FIR filter and M is greater than or equal to 1 when the filter 20 is employed as a FIR filter, as well as to an optional second sampling rate reducer 28. The divide-by-M circuit 26 and the second sampling rate reducer 28 are not required as they only further reduce the sampling rate. One skilled in the art can appreciate that a more gradual reduction of the sampling rate could be employed by utilizing additional stages of filtering. This would allow additional flexibility in selecting the overall ratio of input to output data rates which may be desirable depending on the particular application.

Figure 2:
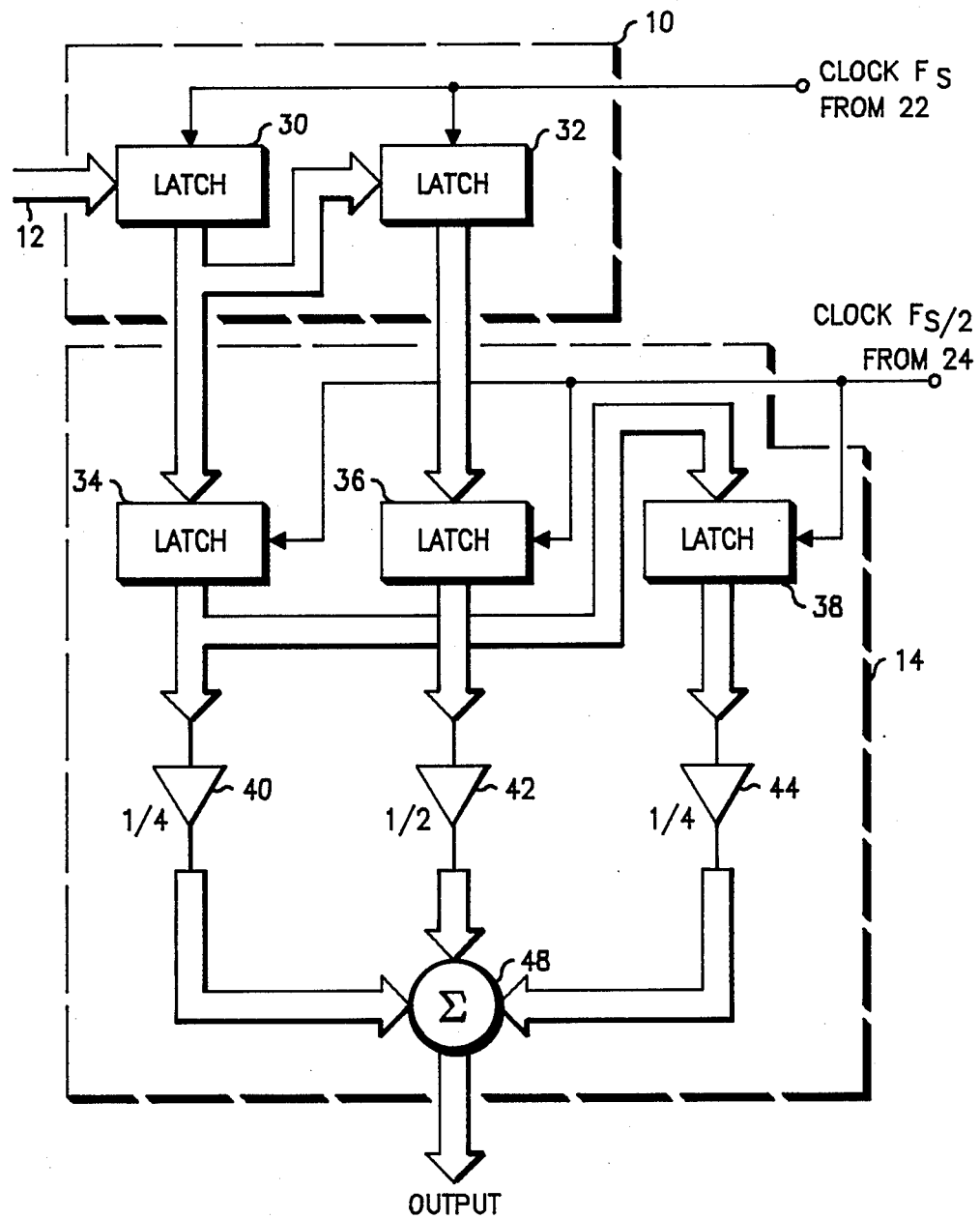
FIG. 2 is a detailed block diagram including the first filter section of FIG. 1.

Referring now to FIG. 2, the mixer latch 10 and the N-order decimating filter 14 from FIG. 1 are shown as an integrated arrangement. Although this embodiment depicts an 2nd-order decimating filter, it should be understood by one skilled in the art that this configuration may be modified to accommodate higher order filter implementations. However, some of the advantages, subsequently discussed, would be compromised in a higher order implementation. Hence, a low order filter, such as a second or third order filter, is preferred. The order of this filter is dependent on the signal channel bandwidth of be recovered by the receiver.

The input zero IF signal 12 is bussed to latch 30 at the rising edge FS clock. The same data is subsequently latched into latch 32 at the next rising edge of FS clock. Clock FS/2 latches the outputs of latches 30 and 32 into latches 34 and 36, respectively. Clock FS/2 additionally latches the output of latch 34 into latch 38. Multiplier blocks 40, 42 and 44 multiply the data words output from latches 34, 36 and 38, respectively by predetermined coefficients. The predetermined coefficients depicted in this embodiment have been selected to facilitate implementation. By selecting the coefficients as $\frac{1}{4}$, $\frac{1}{2}$ and $\frac{1}{4}$, respectively, the multiplier blocks 40, 42 and 44 are implemented by simple arithmetic shift-rights. In this embodiment, simply routing the data bus lines to allow the shift is adequate as will as preferred. This may not be feasible in a higher order implementation. Finally, the shifted latch outputs are added in a summing circuit 48. One skilled in the art can appreciate that the latches 30 thru 38 and the summing circuit 48 can readily be implemented with any of an assortment of commercially available digital integrated circuits.

Figure 3:
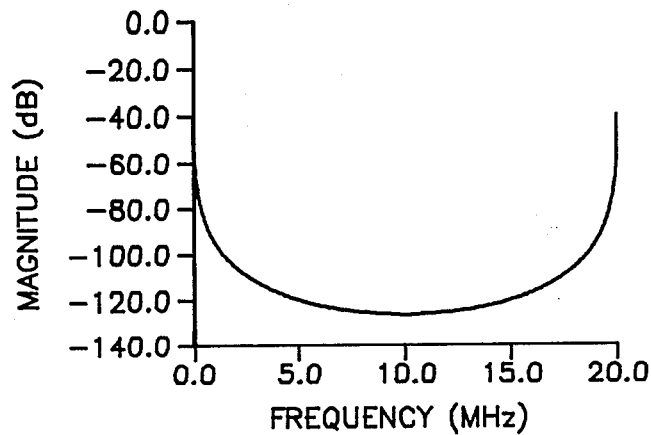
FIG. 3 is a graphical representation of the desired response of an optimal filter section operating at full speed.

Referring now to FIG. 3, a magnitude verses frequency plot representing the desired IF selectivity section response is illustrated. The response is one that would result from direct implementation of a high order digital low pass filter, presuming it was capable of running at full speed. The response depicts a very narrow pass-band, several kHz, and a stop-band extending to 10 MHz. As with any digital filter, the response is a mirror image about the sampling frequency divided by 2, from zero Hertz to the sampling frequency. Hence, the response depicted assumes a digital low pass filter operating at 20 MHz band-limiting a signal centered at zero Hertz.

Figure 4:
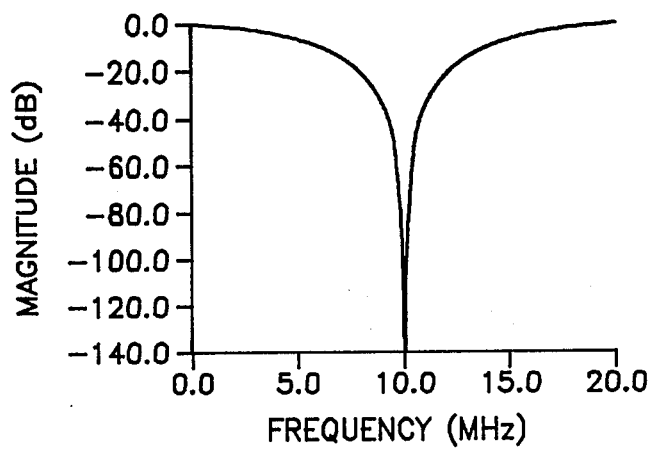
FIG. 4 is a graphical representation of the response of the first filter section of FIG. 1.

Referring now to FIG. 4, a magnitude verses frequency plot representing the 2nd-order decimating FIR filter in FIG. 3 is illustrated. The plot depicts a pass-band extending several MHz with a steep roll-off at 10 MHz. The 2nd-order decimating filter therefore provides an excellent pass-band while preventing aliasing error and allowing decimation for the additional digital low pass filter 20 of FIG. 1.

Figure 5:
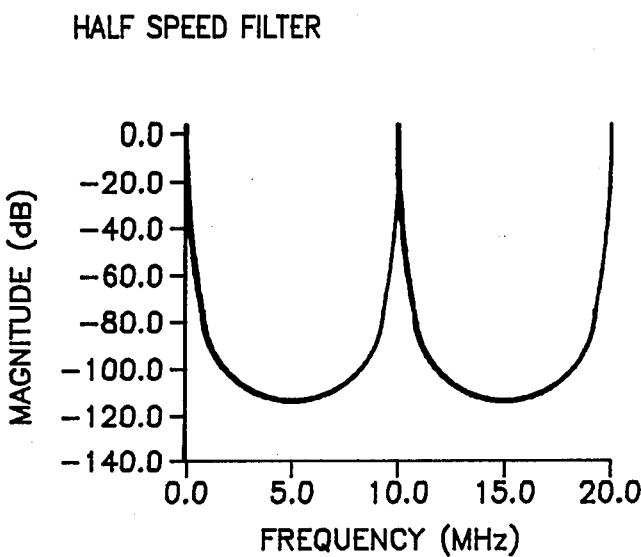
FIG. 5 is a graphical representation of the response of the second filter section of FIG. 1.

Referring now to FIG. 5, a magnitude verses frequency plot representing a typical digital low pass filter, specifically filter 20 in FIG. 1, is illustrated. The plot depicts a very narrow pass-band, several kHz, and a stop-band extending to 5 MHz. Since the sampling rate for digital low pass filter 20 is only at 10 MHz, the response mirrors about 5 MHz. The critical response spectrum, however, is the narrow pass-band.

Figure 6:
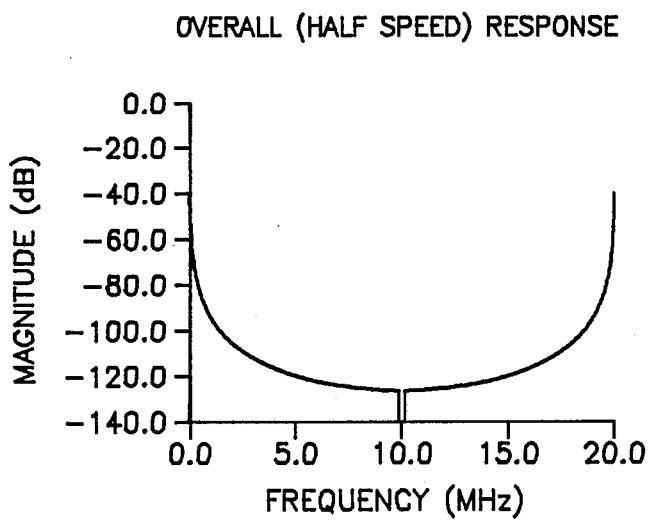
FIG. 6 is a graphical representation of the overall response of the first and second filter sections of FIG. 1.

Referring now to FIG. 6, a magnitude verses frequency plot representing the overall response of the filter arrangement in FIG. 1 is illustrated. The plot is almost identical to the desired response depicted in FIG. 1. However, at 10 MHz an imperfection is shown which is not critical in practice. Since, the filter arrangement depicted in FIG. 1 is effectively operating at only half-speed, one skilled in the art can appreciate that its frequency response is practically identical to the ideal full-speed frequency response. Moreover, the limited amount of hardware necessary for its implementation makes it additionally advantageous.

While the invention has been particularly shown and described with reference to a preferred embodiment, it will be understood by those skilled in the art that various other modifications and changes may be made to the present invention described above without departing from the spirit and scope thereof.

What is claimed is:

1. A digital zero-IF selectivity section circuit operating on a recovered input signal, digitally clocked by a first clock at a rate of FS, in a receiver device, comprising:
    second clock means for providing a periodic clock signal at a lesser rate than said first clock means;
    first N-order decimating FIR digital filtering means, coupled to said second clock means, for selectively band-limiting the frequency spectrum of the recovered input signal;
    one or more second digital filtering means, coupled to the output of said first N-order decimating FIR digital filtering means and operating at a clock rate less than or equal to said second clock rate, for further selectively band-limiting the frequency spectrum of the recovered input signal.

2. The digital zero-IF selectivity section circuit, according to claim 1, wherein said lesser rate of said second clock means is one-half the first clock rate.

3. The digital zero-IF selectivity section circuit, according to claim 1, further including means for coupling said second clock means to said second digital filter means.

4. The digital zero-IF selectivity section circuit, according to claim 1, including a third clock means operating the second digital filter means at a clock rate defined according to the order of said second digital filter means.

5. The digital zero-IF selectivity section circuit, according to claim 1, further including means for sampling the recovered input signal at a further reduced rate after it is filtered by said second digital filter means.

6. The digital zero-IF selectivity section circuit, according to claim 1, wherein said first N-order decimating FIR digital filter means includes means for sampling the recovered input signal at a reduced rate.

7. The digital zero-IF selectivity section circuit, according to claim 6, further including means for coupling said second clock means to said means for sampling the recovered input signal at a reduced rate.

8. The digital zero-IF selectivity section circuit, according to claim 1, further including a plurality of latches, clocked by said first clock means, for sequentially latching data to said first N-order decimating FIR digital filter means.

9. The digital zero-IF selectivity section circuit, according to claim 1, wherein said first N-order decimating FIR digital filter means includes an N-order FIR filter.

10. The digital zero-IF selectivity section circuit, according to claim 9, wherein said N-order decimating FIR filter means includes a plurality of. latches, clocked by said second clock means, for sequentially latching data from the recovered input signal.

11. The digital zero-IF selectivity section circuit, according to claim 10, wherein said N-order decimating FIR filter includes at least one additional latch, clocked by said second clock means, for sequentially latching data from selected one of said second plurality of latches.

12. The digital zero-IF selectivity section circuit, according to claim 9, wherein said N-order decimating FIR filter includes means for multiplying coefficients corresponding to a predetermined filtering algorithm of said N-order decimating FIR filter.

13. The digital zero-IF selectivity section circuit, according to claim 9, wherein said N-order decimating FIR filter includes means for adding decimated samples to generate a band-limited recovered input signal.

14. The digital zero-IF selectivity section circuity according to claim 1, including means to prevent aliasing error.

15. In a digital zero-IF selectivity section circuit operating on a recovered input signal, clocked by a first clock at a rate of FS, in a receiver device, a method of filtering, comprising the steps of:
    providing a second periodic clock signal at a lesser rate than said first clock;
    digitally filtering, by a first N-order decimating FIR filter means coupled to said second clock, to selectively band-limit the frequency spectrum of the recovered input signal;
    digitally filtering, by one or more second digital filtering means coupled to the output of said first N-order decimating FIR digital filtering means and operating at a clock rate less than or equal to said second clock signal, to further selectively band-limit the frequency spectrum of the recovered input signal.

16. The method of filtering, according to claim 15, wherein said lesser rate of said second clock is one-half the first clock rate.

17. The method of filtering, according to claim 15, further including the step of providing means for coupling said second clock to said second digital filter means.

18. The method of filtering, according to claim 15, including the step of providing a third clock means operating the second digital filter means at a clock rate defined according to the order of said second digital filter means.

19. The method of filtering, according to claim 15, further including the step of providing means for sampling the recovered input signal at a reduced rate after it is filtered by said second dligital filter means.

20. The method of filtering, according to claim 15, wherein the step of providing said first N-order decimating FIR digital filter means includes sampling the recovered input signal at a reduced rate.

21. The method of filtering, according to claim 15, further including the step of latching, through a plurality of latches clocked by said first clock, to sequentially latch data to said first N-order decimating FIR digital filter means.

22. The method of filtering, according to claim 21, wherein said first N-order decimating FIR digital filter means includes an N-order FIR filter.

23. The method of filtering, according to claim 22, wherein said N-order decimating FIR filter means includes a plurality of latches, clocked by said second clock means, for sequentially latching data from the recovered input signal.

24. The method of filtering, according to claim 23, wherein said N-order decimating FIR filter includes at least one additional latch, clocked by said second clock means, for sequentially latching data from selected ones of said second plurality of latches 25. The method of filtering, accordirg to claim 22, wherein said N-order decimating FIR filter includes means for multiplying coefficients corresponding to a predetermined filtering algorithm of said N-order decimating FIR filter.

26. The method of filtering, according to claim 22, wherein said N-order decimating FIR filter includes means for adding decimated samples to generate a band-limited recovered input signal.

* * * * *